United States Patent
Chowdhury et al.

(10) Patent No.: US 12,272,758 B2
(45) Date of Patent: Apr. 8, 2025

(54) PHOTODETECTORS AND ABSORBERS WITH SLANTED LIGHT INCIDENCE

(71) Applicant: GLOBALFOUNDRIES U.S. Inc., Santa Clara, CA (US)

(72) Inventors: Asif J. Chowdhury, Clifton Park, NY (US); Yusheng Bian, Ballston Lake, NY (US); Abdelsalam Aboketaf, Essex Junction, VT (US); Andreas D. Stricker, Essex Junction, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 283 days.

(21) Appl. No.: 17/241,525

(22) Filed: Apr. 27, 2021

(65) Prior Publication Data

US 2022/0344523 A1 Oct. 27, 2022

(51) Int. Cl.
*H01L 31/0232* (2014.01)
*G02B 6/24* (2006.01)
*G02B 6/12* (2006.01)

(52) U.S. Cl.
CPC ........ *H01L 31/02327* (2013.01); *G02B 6/243* (2013.01); *G02B 6/12004* (2013.01)

(58) Field of Classification Search
CPC ............ G02B 27/0172; G02B 6/12004; G02B 6/125; G02B 6/0028; G02B 6/1228; G02B 6/42; G02B 6/122; G02B 6/243; G02B 6/241; G02B 6/24; G02B 2006/12147; H01L 31/02327; H01L 31/035281; H01L 31/105

See application file for complete search history.

(56) References Cited

U.S. PATENT DOCUMENTS

| | | | |
|---|---|---|---|
| 7,616,904 B1 | 11/2009 | Gunn, III et al. | |
| 9,274,280 B2 * | 3/2016 | Ushida | G02B 6/12 |
| 10,429,581 B1 * | 10/2019 | Thomas | G02B 6/126 |
| 10,444,433 B1 * | 10/2019 | Bian | G02B 6/136 |
| 10,910,503 B1 | 2/2021 | Bian et al. | |
| 10,983,412 B1 * | 4/2021 | Jain | G02F 1/0147 |

(Continued)

OTHER PUBLICATIONS

Cong Hui, Xue Chunlai, Liu Zhi, Li Chuanbo, Cheng Buwen, Wang Qiming, "High-speed waveguide-integrated Ge/Si avalanche photodetector. Chinese Physics B, 2016, 25(5)".

(Continued)

*Primary Examiner* — Jennifer D Bennett
*Assistant Examiner* — Erin R Garber
(74) *Attorney, Agent, or Firm* — Thompson Hine LLP; Anthony Canale (57) ABSTRACT

Structures for a photodetector or light absorber and methods of forming a structure for a photodetector or light absorber. The structure includes a pad, a waveguide core adjoined to the pad, and a light-absorbing layer on the pad. The waveguide core includes a first longitudinal axis, and the light-absorbing layer includes a second longitudinal axis and an end surface intersected by the second longitudinal axis. The end surface of the light-absorbing layer is positioned adjacent to the waveguide core. The first longitudinal axis of the first waveguide core is inclined relative to the second longitudinal axis of the light-absorbing layer and/or the end surface slanted relative to the second longitudinal axis.

20 Claims, 11 Drawing Sheets

(56) References Cited

U.S. PATENT DOCUMENTS

| | | | | |
|---|---|---|---|---|
| 2010/0193769 | A1* | 8/2010 | Occhi | H01L 33/44 |
| | | | | 257/E33.048 |
| 2017/0345952 | A1* | 11/2017 | Yashiki | G02B 6/26 |
| 2019/0212498 | A1 | 7/2019 | Fathololoumi et al. | |
| 2019/0219782 | A1* | 7/2019 | Liow | G02B 6/43 |
| 2019/0353845 | A1* | 11/2019 | Fathololoumi | G02B 6/12004 |
| 2020/0379314 | A1* | 12/2020 | Hashiya | G02F 1/015 |
| 2021/0135024 | A1* | 5/2021 | Chiang | H01L 31/028 |
| 2021/0167231 | A1* | 6/2021 | Cardwell | H01L 31/02161 |
| 2021/0223478 | A1* | 7/2021 | Song | G02B 6/1228 |
| 2021/0373243 | A1* | 12/2021 | Krueger | G02B 6/305 |

OTHER PUBLICATIONS

Y. Bian, et al., "Towards low-loss monolithic silicon and nitride photonic building blocks in state-of-the-art 300mm CMOS foundry," in Frontiers in Optics / Laser Science, B. Lee, C. Mazzali, K. Corwin, and R. Jason Jones, eds., OSA Technical Digest (Optical Society of America, 2020), paper FW5D.2.

M. Rakowski, et al., "45nm CMOS—Silicon Photonics Monolithic Technology (45CLO) for next-generation, low power and high speed optical interconnects," in Optical Fiber Communication Conference (OFC) 2020, OSA Technical Digest (Optical Society of America, 2020), paper T3H.3.

K. Giewont et al., "300-mm Monolithic Silicon Photonics Foundry Technology," in IEEE Journal of Selected Topics in Quantum Electronics, vol. 25, No. 5, pp. 1-11, Sep.-Oct. 2019, Art No. 8200611.

Long Chen, Po Dong, and Michal Lipson, "High performance germanium photodetectors integrated on submicron silicon waveguides by low temperature wafer bonding," Opt. Express 16, 11513-11518 (2008).

Jeong Hwan Song, Tangla D. Kongnyuy, Naser Hosseini, Pieter Neutens, Federico Buja, Roelof Jansen, and Xavier Rottenberg, "Angled-MMI-based wavelength splitters on silicon nitride waveguide platforms for fluorescence sensing," Appl. Opt. 56, 8055-8060 (2017).

Bo Peng, Tymon Barwicz, Yusheng Bian, Asli Sahin, Thomas Houghton, Shuren Hu, Michal Rakowski, Javier Ayala, Colleen Meagher, Zoey Sowinski, Andy Stricker, Ajey Jacob, Karen Nummy, and Ken Giewont, "Controlling optical return loss in production silicon photonic metamaterial fiber couplers," Opt. Lett. 46, 400-403 (2021).

Buzzin, Alessio; Asquini, Rita; Caputo, Domenico; de Cesare, Giampiero. 2021. "On-Glass Integrated SU-8 Waveguide and Amorphous Silicon Photosensor for On-Chip Detection of Biomolecules: Feasibility Study on Hemoglobin Sensing" Sensors 21, No. 2: 415.

Solomon Assefa, Fengnian Xia, Stephen W. Bedell, Ying Zhang, Teya Topuria, Philip M. Rice, and Yurii A. Vlasov, "CMOS-integrated high-speed MSM germanium waveguide photodetector," Opt. Express 18, 4986-4999 (2010).

D. Chatzitheocharis, D. Ketzaki, C. Calò, C. Caillaud, and K. Vyrsokinos, "Design of Si-rich nitride interposer waveguides for efficient light coupling from InP-based QD-emitters to Si3N4 waveguides on a silicon substrate," Opt. Express 28, 34219-34236 (2020).

H. Chen, P. Verheyen, P. De Heyn, G. Lepage, J. De Coster, S. Balakrishnan, P. Absil, W. Yao, L. Shen, G. Roelkens, and J. Van Campenhout, "-1 V bias 67 GHz bandwidth Si-contacted germanium waveguide p-i-n photodetector for optical links at 56 Gbps and beyond," Opt. Express 24, 4622-4631 (2016).

S. Assefa, F. Xia, S. W. Bedell, Y. Zhang, T. Topuria, P. M. Rice, and Y. A. Vlasov, "CMOS-Integrated 40GHz Germanium Waveguide Photodetector for On-chip Optical Interconnects," in Optical Fiber Communication Conference and National Fiber Optic Engineers Conference, OSA Technical Digest (CD) (Optical Society of America, 2009), paper OMR4.

Donghwan Ahn, Ching-yin Hong, Jifeng Liu, Wojciech Giziewicz, Mark Beals, Lionel C. Kimerling, Jurgen Michel, Jian Chen, and Franz X. Kärtner, "High performance, waveguide integrated Ge photodetectors," Opt. Express 15, 3916-3921 (2007).

Kyle Preston, Yoon Ho Daniel Lee, Mian Zhang, and Michal Lipson, "Waveguide-integrated telecom-wavelength photodiode in deposited silicon," Opt. Lett. 36, 52-54 (2011).

* cited by examiner

PHOTODETECTORS AND ABSORBERS WITH SLANTED LIGHT INCIDENCE

BACKGROUND

The present invention relates to photonics chips and, more specifically, to structures for a photodetector or light absorber and methods of forming a structure for a photodetector or light absorber.

Photonics chips are used in many applications and systems including, but not limited to, data communication systems and data computation systems. A photonics chip integrates optical components, such as waveguides, optical switches, and directional couplers, and electronic components, such as field-effect transistors, into a unified platform. Among other factors, layout area, cost, and operational overhead may be reduced by the integration of both types of components on the same chip.

Photonics chips may include photodetectors that convert modulated pulses of light into an electrical signal. A photodetector may suffer from significant back reflection due to a refractive index mismatch between the material of the photodetector and the material of a waveguide supplying the light pulses to the photodetector. Back reflection contributes to optical return loss, and also contributes to reductions in both responsivity and quantum efficiency.

Improved structures for a photodetector or light absorber and methods of forming a structure for a photodetector or light absorber are needed.

SUMMARY

In an embodiment of the invention, a structure includes a pad, a waveguide core adjoined to the pad, and a light-absorbing layer on the pad. The waveguide core includes a first longitudinal axis, and the light-absorbing layer includes a second longitudinal axis and an end surface intersected by the second longitudinal axis. The end surface of the light-absorbing layer positioned adjacent to the waveguide core. The first longitudinal axis of the first waveguide core is inclined relative to the second longitudinal axis of the light-absorbing layer.

In an embodiment of the invention, a structure includes a pad, a waveguide core adjoined to the pad, and a light-absorbing layer on the pad. The first waveguide core includes a longitudinal axis, the light-absorbing layer includes an end surface positioned adjacent to the waveguide core, and the end surface is slanted relative to the longitudinal axis.

In an embodiment of the invention, a method includes forming a pad and a waveguide core adjoined to the pad, and forming a light-absorbing layer on the pad. The first waveguide core includes a first longitudinal axis. The light-absorbing layer includes a second longitudinal axis and an end surface intersected by the second longitudinal axis. The end surface of the light-absorbing layer is positioned adjacent to the first waveguide core. The first longitudinal axis of the first waveguide core is inclined relative to the second longitudinal axis of the light-absorbing layer and/or the end surface is slanted relative to the second longitudinal axis.

BRIEF DESCRIPTION OF THE DRAWINGS

The accompanying drawings, which are incorporated in and constitute a part of this specification, illustrate various embodiments of the invention, and, together with a general description of the invention given above and the detailed description of the embodiments given below, serve to explain the embodiments of the invention. In the drawings, like reference numerals refer to like features in the various views.

DETAILED DESCRIPTION

Figure 1:
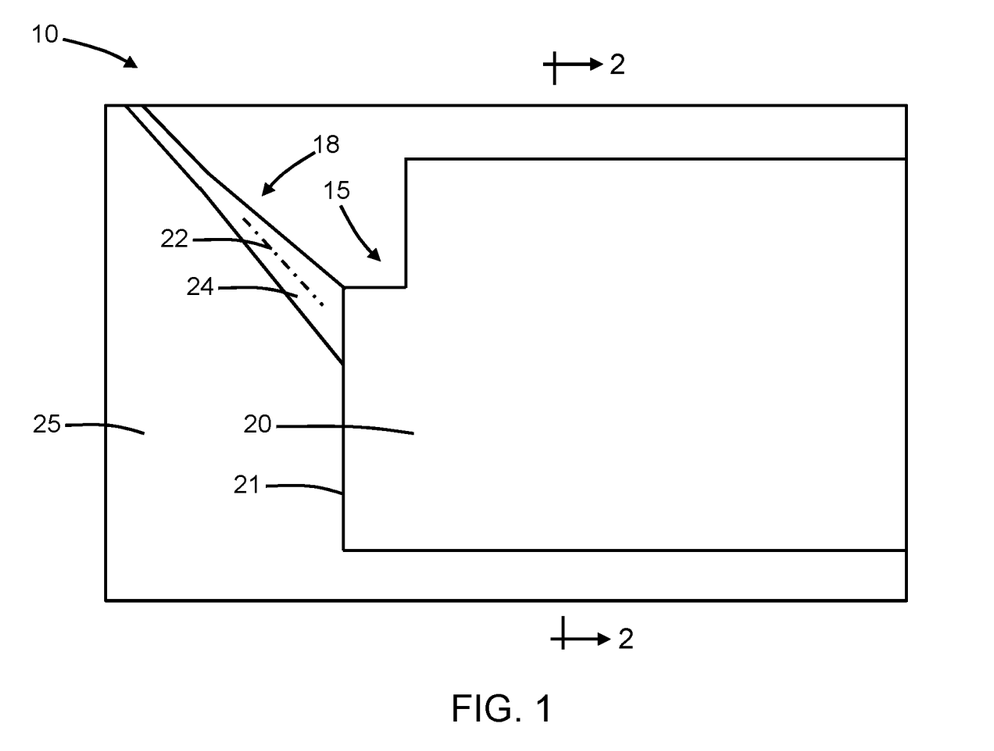
FIG. 1 is a diagrammatic top view of a structure at an initial fabrication stage of a processing method in accordance with embodiments of the invention.
Figure 2:
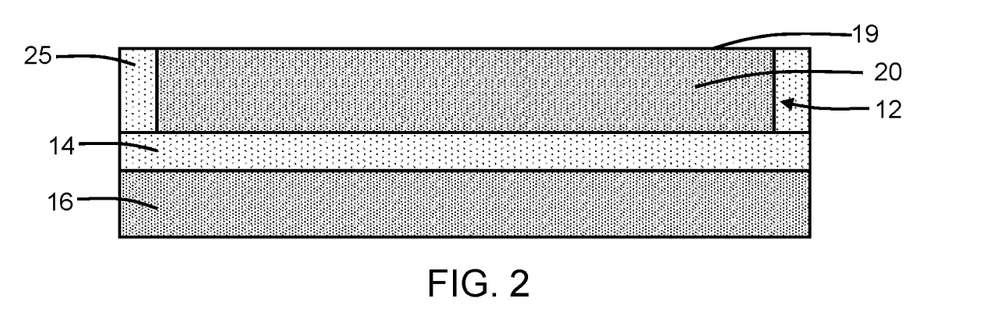
FIG. 2 is a cross-sectional view taken generally along line 2-2 in FIG. 1.

With reference to FIGS. 1, 2 and in accordance with embodiments of the invention, a structure 10 may be formed using a semiconductor-on-insulator (SOI) substrate that includes a device layer 12, a dielectric layer 14, and a handle substrate 16. The device layer 12 is separated from the handle substrate 16 by the intervening dielectric layer 14 and may be significantly thinner than the handle substrate 16. The device layer 12 and the handle substrate 16 may contain a semiconductor material, such as single-crystal silicon, and may be lightly doped to have, for example, p-type conductivity. The dielectric layer 14 may be comprised of a dielectric material that provides low-index cladding and, in an embodiment, may be a buried oxide layer containing silicon dioxide.

The structure 10 includes a pad 20 and a waveguide core 18 that is adjoined to the pad 20. In an embodiment, the waveguide core 18 and pad 20 may be concurrently formed by patterning the device layer 12 with lithography and etching processes. A dielectric layer 25 is deposited and planarized with chemical-mechanical polishing. The dielectric layer 25, which contains a dielectric material (e.g., silicon dioxide), fills the space over the dielectric layer 14 surrounding the waveguide core 18 and pad 20.

The waveguide core 18 has a longitudinal axis 22 extending along its length dimension, and the waveguide core 18 may include a taper 24 that is aligned along the longitudinal axis 22. The pad 20 has a side surface 21, and the taper 24 of the waveguide core 18 intersects the side surface 21 with the longitudinal axis 22 inclined or slanted at an angle relative to the side surface 21. The taper 24 of the waveguide core 18 has a width that increases with decreasing distance from the side surface 21. The pad 20 may include a notch 15 in the side surface 21 adjacent to the taper 24 of the waveguide core 18. The pad 20 is asymmetrical due to the existence and placement of the notch 15.

Figure 3:
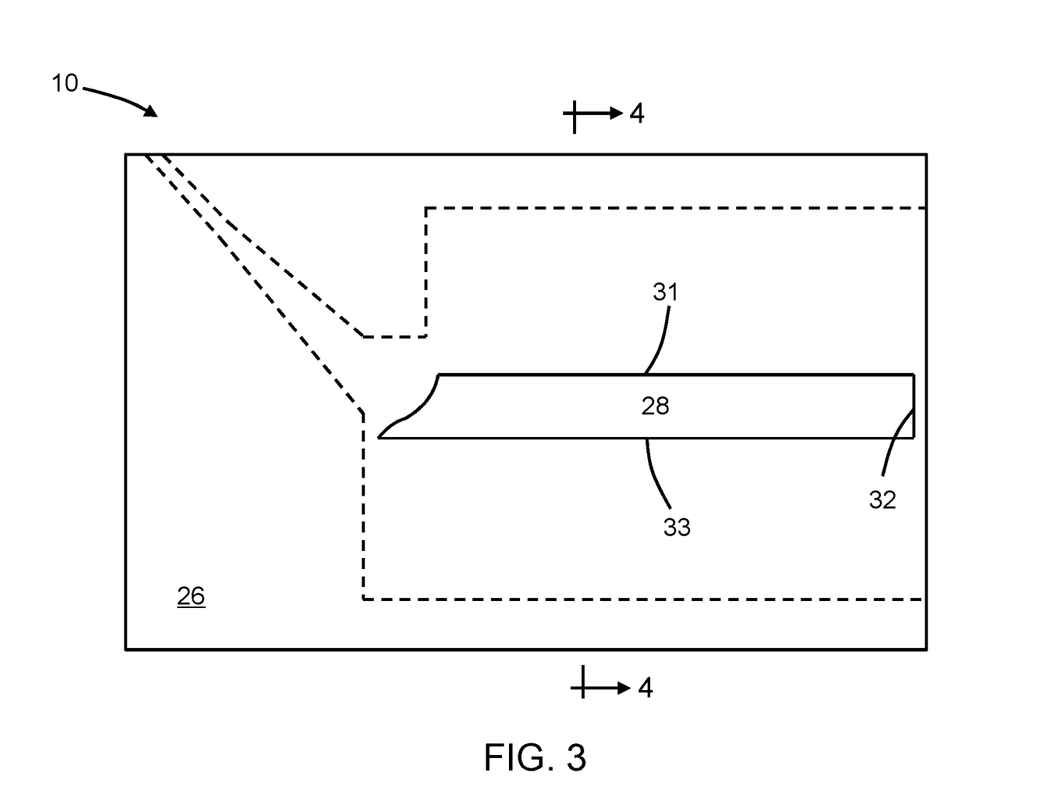
FIG. 3 is a top view of the structure at a fabrication stage of the processing method subsequent to FIG. 1.
Figure 4:
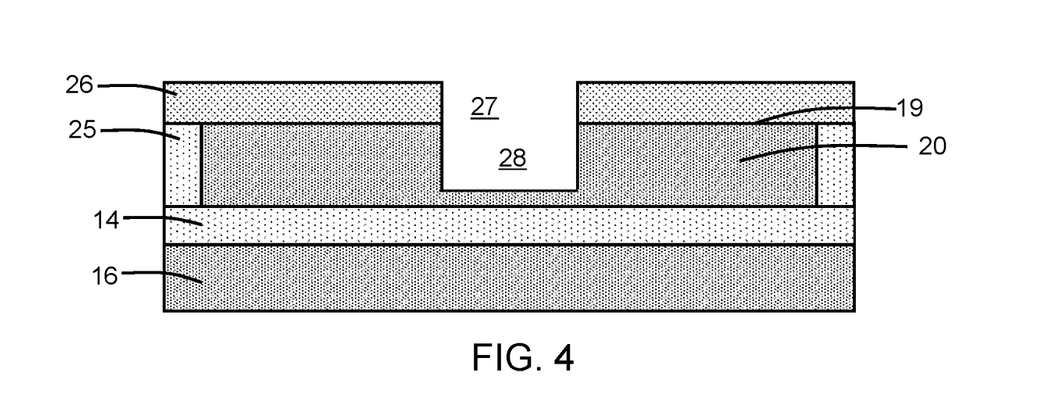
FIG. 4 is a cross-sectional view taken generally along line 4-4 in FIG. 3.

With reference to FIGS. 3, 4 in which like reference numerals refer to like features in FIGS. 1, 2 and at a subsequent fabrication stage, a dielectric layer 26 may be deposited and patterned by lithography and etching processes to define a window or opening 27 having a shape for a subsequently-formed trench. The dielectric layer 26 may be comprised of a dielectric material, such as silicon nitride. The opening 27, which penetrates fully through the dielectric layer 26 to the pad 20, exposes an area on the top surface 19 of the pad 20. The exposed area is only a portion (i.e., a fraction) of the total area of the top surface 19 of the pad 20. The etching process may remove the material of the pad 20 selective to the material of the dielectric layer 26. As used herein, the terms "selective" and "selectivity" in reference to a material removal process (e.g., etching) denote that the material removal rate (i.e., etch rate) for the targeted material is higher than the material removal rate (i.e., etch rate) for at least another material exposed to the same material removal process.

A trench 28 is formed in the pad 20 and penetrates in depth partially through the pad 20. The trench 28 may be patterned by an etching process, such as a reactive ion etching process. The patterned dielectric layer 26 functions as an etch mask during the etching process, and the opening 27 in the patterned dielectric layer 26 defines the location of trench 28 on the top surface 19 of the pad 20 and the shape for the trench 28. As a result, the trench 28 is surrounded in a tub in the pad 20 and the tub is bounded by the semiconductor material of the pad 20. The dielectric layer 26 also covers and masks the waveguide core 18 during the formation of the trench 28.

The trench 28 includes a sidewall 30 that is located adjacent to the taper 24 of the waveguide core 18, a sidewall 32 opposite to the sidewall 30, and opposite sidewalls 31, 33 connecting the sidewall 30 to the sidewall 32. Surfaces of the pad 20 are exposed at the bottom of the trench 28 and at the sidewalls 30, 31, 32, 33 of the trench 28. The sidewall 30 may be inclined relative to the sidewalls 31, 33. In the representative embodiment, the sidewall 30 is curved or dished with a shape having a concave curvature.

Figure 5:
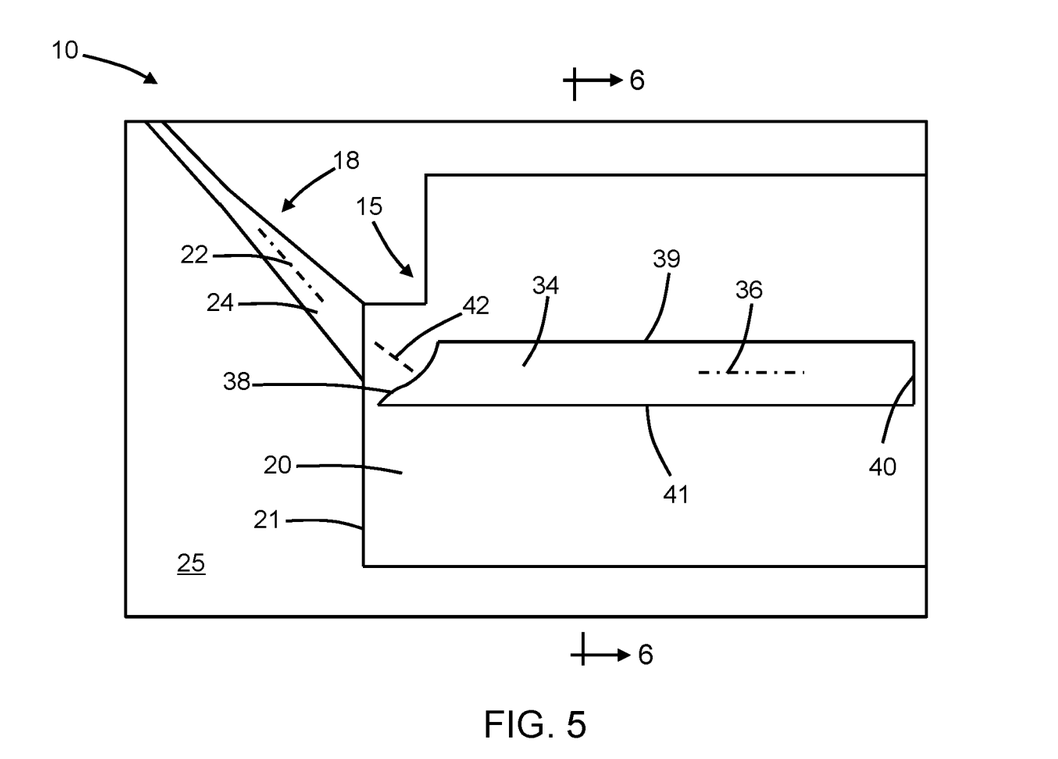
FIG. 5 is a top view of the structure at a fabrication stage of the processing method subsequent to FIG. 3.
Figure 6:
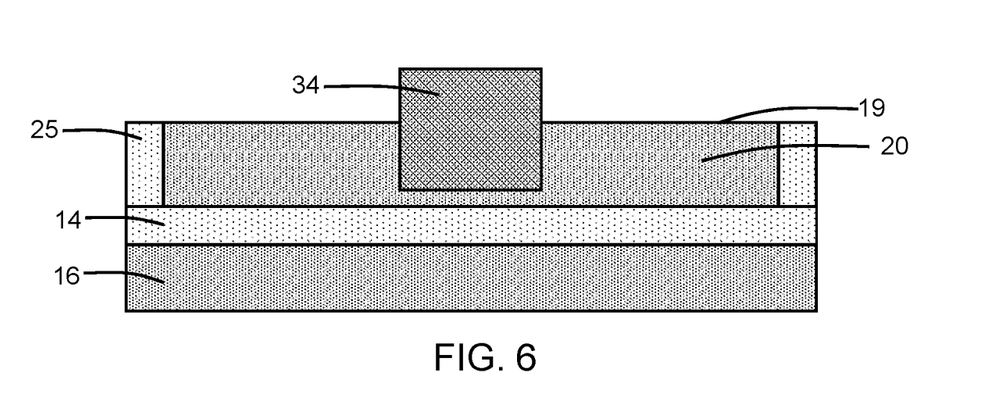
FIG. 6 is a cross-sectional view taken generally along line 6-6 in FIG. 5.

With reference to FIGS. 5, 6 in which like reference numerals refer to like features in FIGS. 3, 4 and at a subsequent fabrication stage, a light-absorbing layer 34 is formed inside the trench 28 and on the pad 20. In an embodiment, the light-absorbing layer 34 may be deposited by a selective epitaxial growth process such that the light-absorbing material deposits inside the trench 28 but does not deposit on the dielectric layer 26. Subsequent to the formation of the light-absorbing layer 34, the dielectric layer 26 may be removed by a selective etching process.

The light-absorbing layer 34 may define a light-absorbing region of a photodetector. The light-absorbing layer 34 may be comprised of a material that generates charge carriers from absorbed light by the photoelectric effect. In an embodiment, the light-absorbing layer 34 may comprise a material having a composition that includes germanium. In an embodiment, the light-absorbing layer 34 may comprise a material having a composition that exclusively contains germanium. The light-absorbing layer 34 may be formed inside the trench 28 such that the light-absorbing material is at least partially embedded in the pad 20. In the representative embodiment, the light-absorbing layer 34 includes a portion that projects above the top surface 19 of the pad 20. In an alternative embodiment, the light-absorbing layer 34 may be coplanar with the top surface 19 of the pad 20.

The light-absorbing layer 34 adapts and conforms to the shape of the trench 28 when formed. In that regard, the light-absorbing layer 34 includes an end surface 38 that is located adjacent to the intersection of the taper 24 of the waveguide core 18 with the pad 20, an end surface 40 opposite to the end surface 38, and opposite side surfaces 39, 41 connecting the end surface 38 to the end surface 40. The light-absorbing layer 34 may be aligned along a longitudinal axis 36, and the longitudinal axis 22 of the waveguide core 18 may be angled or inclined relative to the longitudinal axis 36 of the light-absorbing layer 34. The longitudinal axis 36 intersects each of the end surfaces 38, 40. Light propagates in the waveguide core 18 along the longitudinal axis 22 toward the light-absorbing layer 34 and then propagates along the longitudinal axis 36 away from the waveguide core 18.

In the representative embodiment, the end surface 38 is curved or dished with a shape having a concave curvature. The end surface 38 may be inclined or slanted at angle relative to the longitudinal axis 36 and, in particular, the end surface 38 has a surface normal 42 at any location on the end surface 38 that may be inclined or slanted at an angle relative to the longitudinal axis 36. The longitudinal axis 36 may intersect the end surface 38 at an acute or obtuse angle at any location on the end surface 38.

Figure 7:
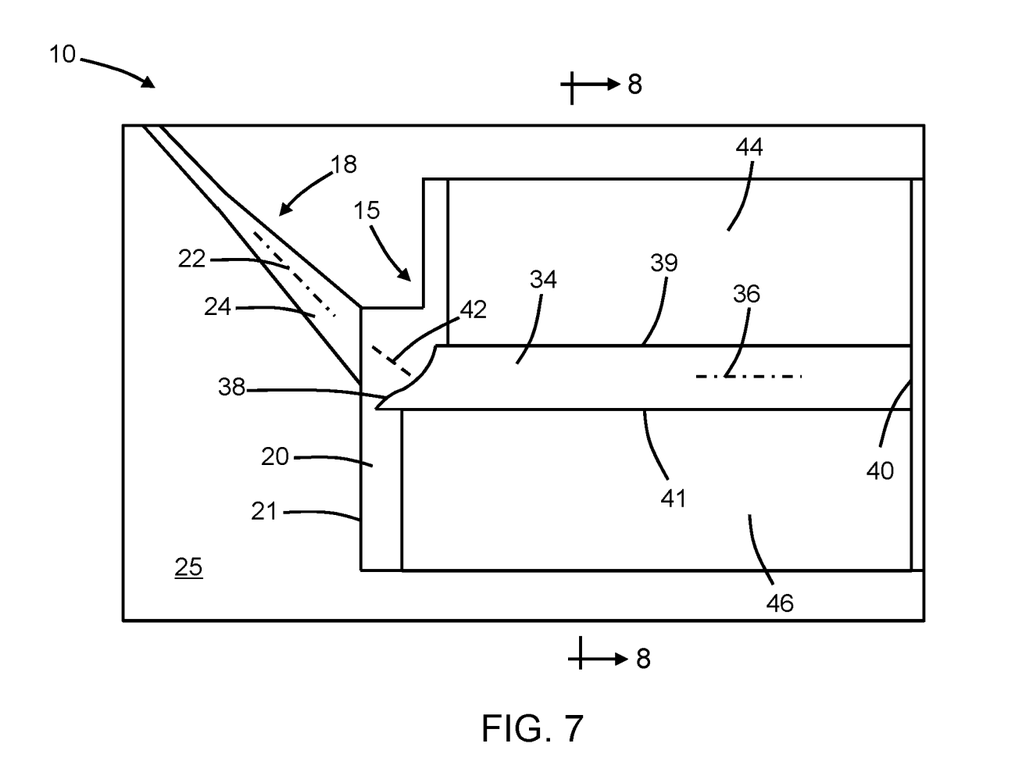
FIG. 7 is a top view of the structure at a fabrication stage of the processing method subsequent to FIG. 5.
Figure 8:
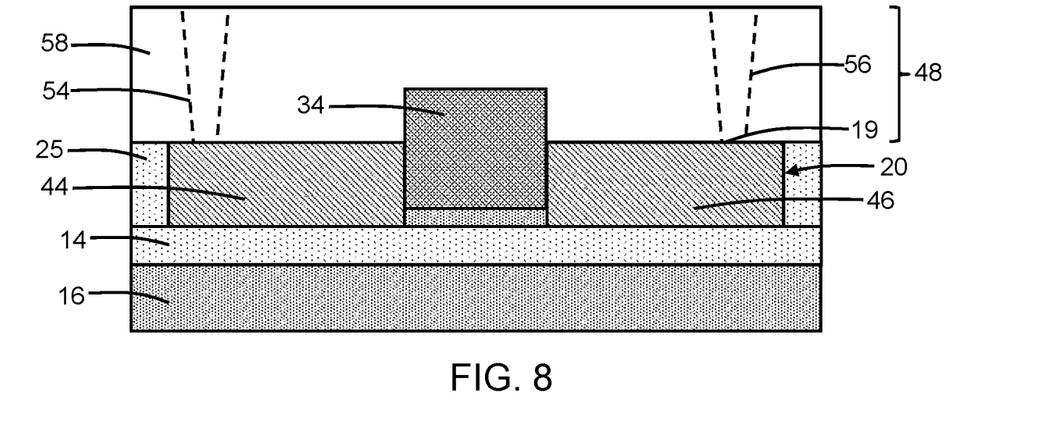
FIG. 8 is a cross-sectional view taken generally along line 8-8 in FIG. 7.

With reference to FIGS. 7, 8 in which like reference numerals refer to like features in FIGS. 5, 6 and at a subsequent fabrication stage, a doped region 44 and a doped region 46 are formed in respective portions of the pad 20. The doped regions 44, 46, which differ in conductivity type, may extend through the entire thickness of the pad 20 to the underlying dielectric layer 14. The light-absorbing layer 34 is laterally positioned between the doped region 44 and the doped region 46. The doped region 44 and the doped region 46 may be arranged adjacent to the opposite side surfaces 39, 41 of the light-absorbing layer 34 to respectively define an anode and a cathode of a photodetector that also includes the light-absorbing layer 34 and the pad 20.

The doped region 44 may be formed by, for example, ion implantation with an implantation mask having an opening that determines an implanted portion of the pad 20. The implantation mask may include a layer of a light-sensitive material, such as a photoresist, applied by a spin-coating process, pre-baked, exposed to light projected through a photomask, baked after exposure, and developed with a chemical developer to define the opening over the area to be implanted. The implantation conditions (e.g., ion species, dose, kinetic energy) may be selected to tune the electrical and physical characteristics of the doped region 44. The implantation mask may be stripped after forming the doped region 44. In an embodiment, the semiconductor material of the doped region 44 may contain a p-type dopant (e.g., boron) that provides p-type electrical conductivity. The doped region 44 may also extend laterally into a portion of the light-absorbing layer 34 adjacent to the side surface 39 due to overlap of the implantation mask and/or diffusion.

The doped region 46 may be formed by, for example, ion implantation with an implantation mask with an opening that determines an implanted portion of the pad 20. The implantation mask may include a layer of a light-sensitive material, such as a photoresist, applied by a spin-coating process, pre-baked, exposed to light projected through a photomask, baked after exposure, and developed with a chemical developer to define the opening over the area to be implanted. The implantation conditions (e.g., ion species, dose, kinetic energy) may be selected to tune the electrical and physical characteristics of the doped region 46. The implantation mask may be stripped after forming the doped region 46. In an embodiment, the semiconductor material of the doped region 46 may contain an n-type dopant (e.g., phosphorus and/or arsenic) that provides n-type electrical conductivity. The doped region 44 may also extend laterally into a portion of the light-absorbing layer 34 adjacent to the side surface 41 due to overlap of the implantation mask and/or diffusion.

In an alternative embodiment, the light-absorbing layer 34 may be epitaxially grown before forming the doped region 44 and forming the doped region 46.

Middle-of-line (MOL) processing and back-end-of-line (BEOL) processing follow, which includes formation of silicide, contacts, vias, and wiring for an interconnect structure 48 that is coupled with the photodetector. In particular, separate sets of contacts 54, 56, may be formed in a dielectric layer 58 of the interconnect structure 48 that respectively extend to the photodetector anode and cathode defined by the doped regions 44, 46.

In use, optical signals in the form of laser light may be guided by the waveguide core 18 to the light-absorbing layer 34 at the end surface 38. The light-absorbing layer 34 absorbs photons of the laser light and converts the absorbed photons into charge carriers. The biasing of the doped regions 44, 46 causes the charge carriers to be collected and output to provide, as a function of time, a measurable photocurrent.

In an alternative embodiment, the doped regions 44, 46 may be omitted such that the light-absorbing layer 34 functions as an absorber instead of a photodetector.

The slanted angle of incidence of the laser light arising from the angling of the waveguide core 18 and/or the angling of the end surface 38 of the light-absorbing layer 34 effectively increases the optical path inside the light-absorbing layer 34. The optical path is increased because the laser light is refracted back and forth at the side surfaces 39, 41 of the light-absorbing layer 34 instead of propagating parallel to the longitudinal axis 36. The length of the light-absorbing layer 34 between the opposite end surfaces 38, 40 can be shortened due to the effective increase in the optical path. The shortening of the length of the light-absorbing layer 34 may be effective to, for example, reduce dark current. Similarly, the inclined incidence of the laser light due to the angling of the waveguide core 18 may also lower the reflection of the laser light back into the waveguide core 18.

Figure 9:
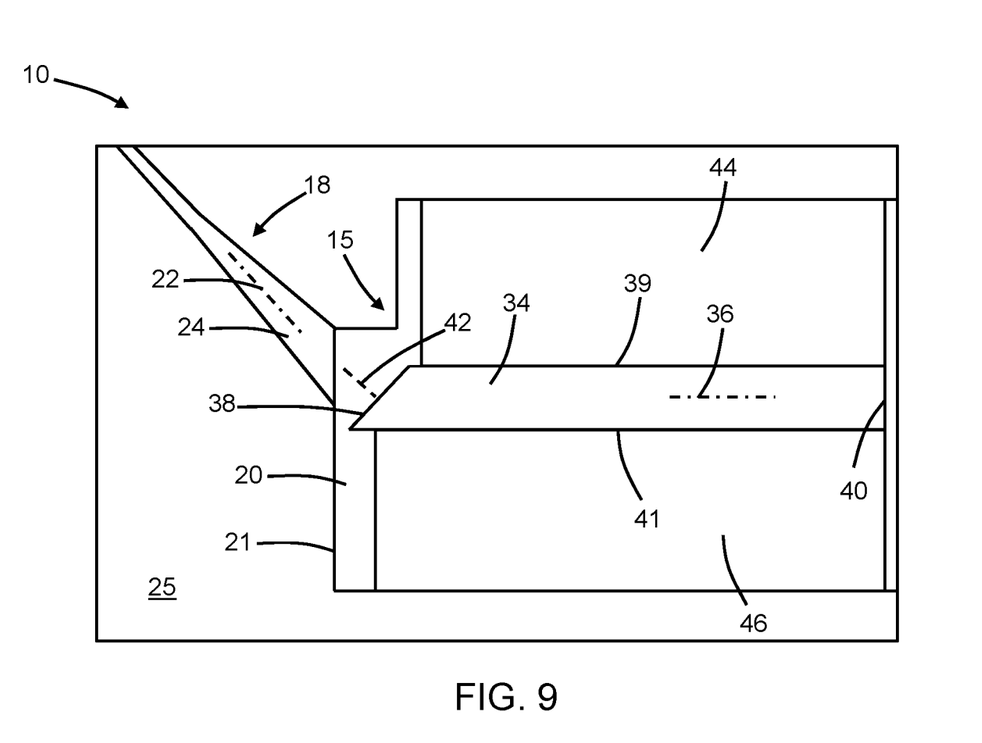
FIGS. 9-15 are top views of structures in accordance with alternative embodiments of the invention.

With reference to FIG. 9 in which like reference numerals refer to like features in FIG. 7 and in accordance with alternative embodiments, the end surface 38 of the light-absorbing layer 34 may be planar or flat instead of curved. The planar or flat end surface 38 is inclined or slanted relative to the longitudinal axis 36. In particular, the surface normal 42 of the end surface 38 is inclined or slanted relative to the longitudinal axis 36, which intersects the end surface 38 at an acute or obtuse angle. In an embodiment, the surface normal 42 of the end surface 38 may be aligned parallel with the longitudinal axis 22 of the waveguide core 18 or collinear with the longitudinal axis 22 of the waveguide core 18.

Figure 10:
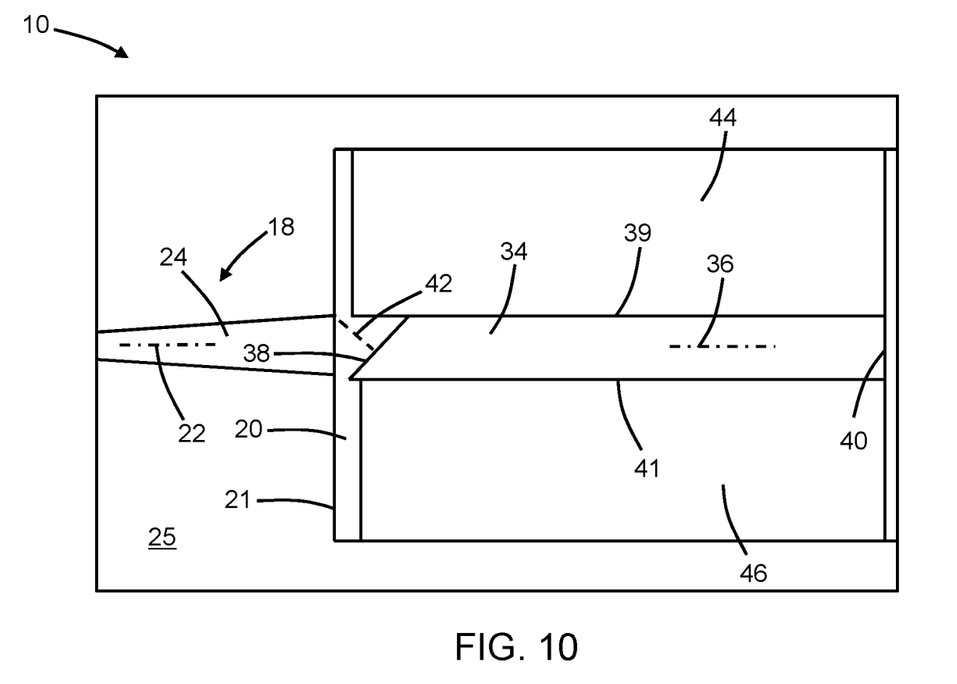

With reference to FIG. 10 in which like reference numerals refer to like features in FIG. 7 and in accordance with alternative embodiments, the waveguide core 18 may be realigned such that the longitudinal axis 22 of the waveguide core 18 is oriented perpendicular to the side surface 21 of the pad 20 instead of being slanted or angled. The end surface 38 of the light-absorbing layer 34 may be inclined or slanted relative to the longitudinal axis 36 and, in particular, the surface normal 42 of the end surface 38 may be inclined or slanted relative to the longitudinal axis 36. The surface normal 42 of the end surface 38 is also inclined or slanted relative to the longitudinal axis 22 of the waveguide core 18, which may be aligned parallel with the longitudinal axis 36 or collinear with the longitudinal axis 36.

Figure 11:
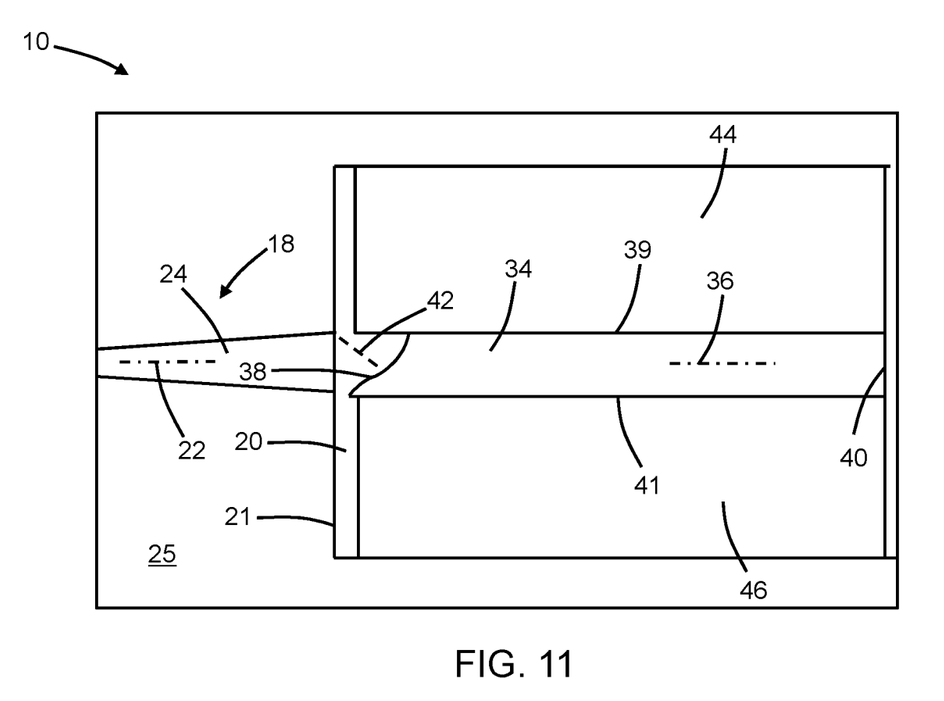

With reference to FIG. 11 in which like reference numerals refer to like features in FIG. 10 and in accordance with alternative embodiments, the end surface 38 of the light-absorbing layer 34 may be modified to have the curved or dished shape characterized by the concave curvature. The surface normal 42 of the end surface 38 may be inclined or slanted relative to the longitudinal axis 36 at any position on the end surface 38 and, in particular, the surface normal 42 of the end surface 38 may be inclined or slanted relative to the longitudinal axis 36 at any position on the end surface 38.

Figure 12:
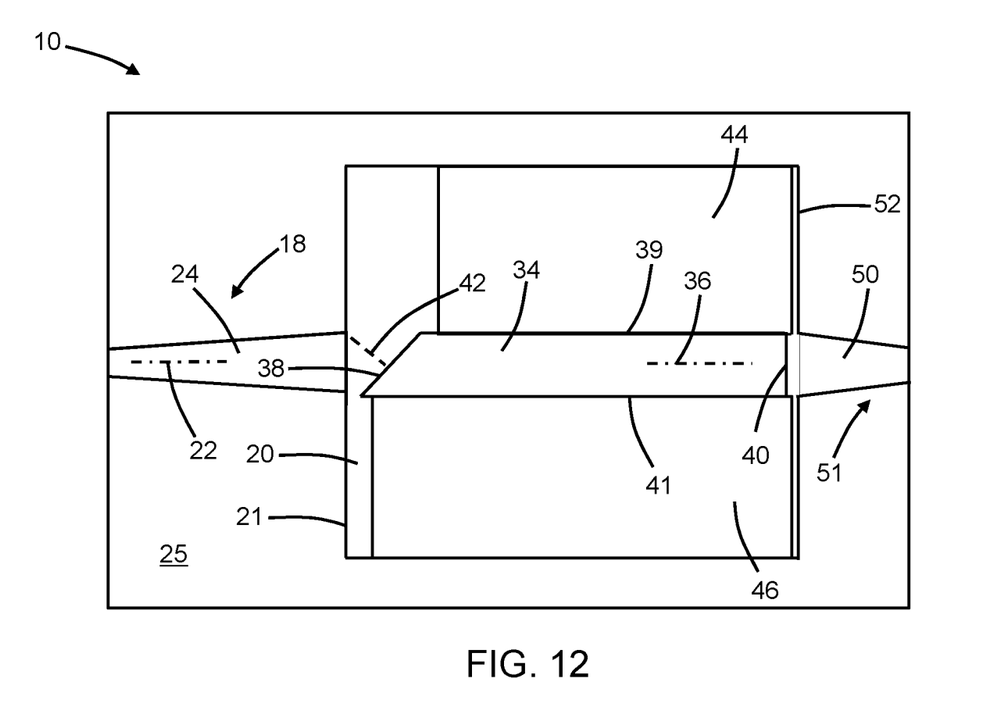

With reference to FIG. 12 in which like reference numerals refer to like features in FIG. 10 and in accordance with alternative embodiments, another waveguide core 51 may be adjoined to the pad 20 in addition to the waveguide core 18. In the representative embodiment, the waveguide core 51 may include a taper 50 that is connected to the pad 20 adjacent to the end surface 40 of the light-absorbing layer 34. The waveguide core 51 is adjoined to a side surface 52 of the pad 20 that is lengthwise opposite to the side surface 21 to which the waveguide core 18 is adjoined. The doped region 44 may be laterally offset relative to the end surface 38 of the light-absorbing layer 34.

Figure 13:
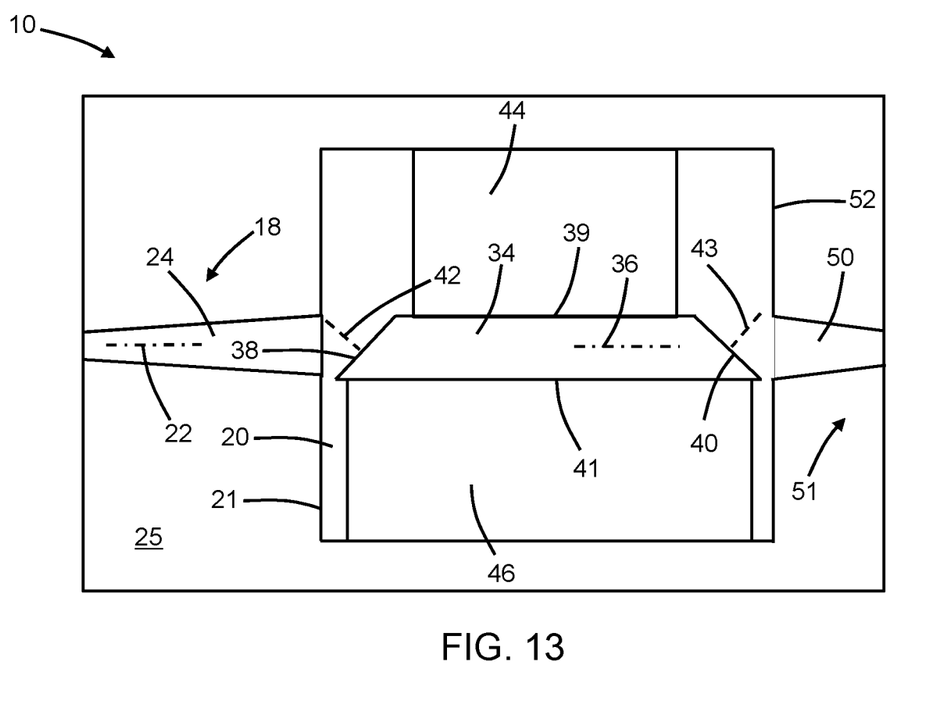

With reference to FIG. 13 in which like reference numerals refer to like features in FIG. 12 and in accordance with alternative embodiments, the end surface 40 of the light-absorbing layer 34 may also be slanted similar or identical to the slanting of the end surface 38 of the light-absorbing layer 34. The end surface 40 may include a surface normal 43 that is inclined or slanted at an angle relative to the longitudinal axis 36 of the light-absorbing layer 34, which intersects the end surface 38. In an alternative embodiment, the end surface 40 of the light-absorbing layer 34 may be modified to have the curved or dished shape characterized by the concave curvature. The doped region 44 may be laterally offset relative to both of the end surfaces 38, 40 such that the doped region 44 is fully positioned between the end surface 38 and the end surface 40 of the light-absorbing layer 34.

Figure 14:
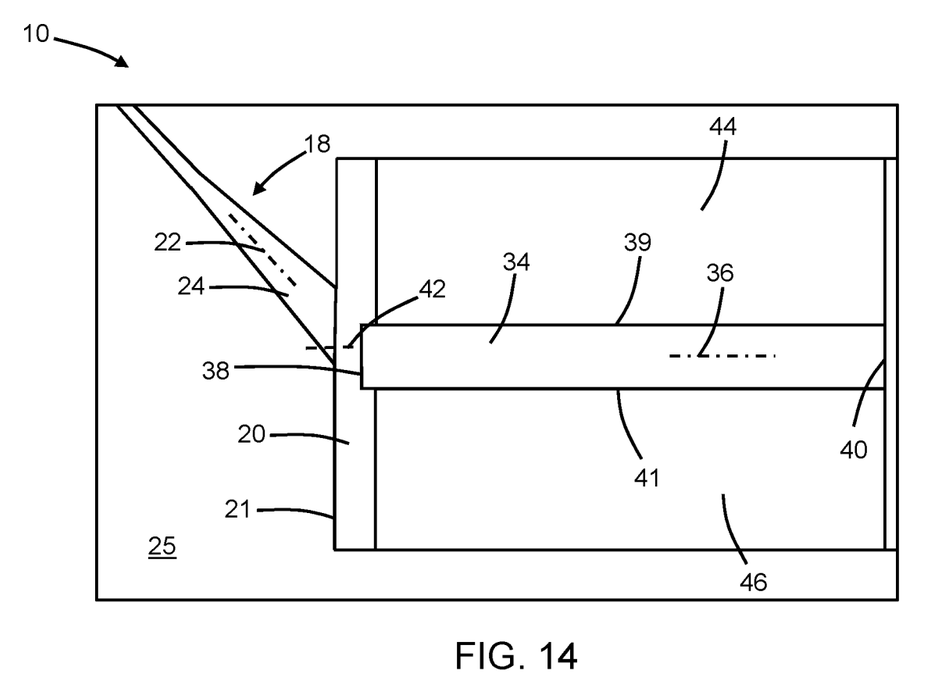

With reference to FIG. 14 in which like reference numerals refer to like features in FIG. 9 and in accordance with alternative embodiments, the end surface 40 of the light-absorbing layer 34 may be modified to not be slanted such that the longitudinal axis 22 of the waveguide core 18 alone is angled relative to the longitudinal axis 36 of the light-absorbing layer 34. The notch 15 may also be eliminated from the pad 20 such that the asymmetry of the pad 20 is absent.

Figure 15:
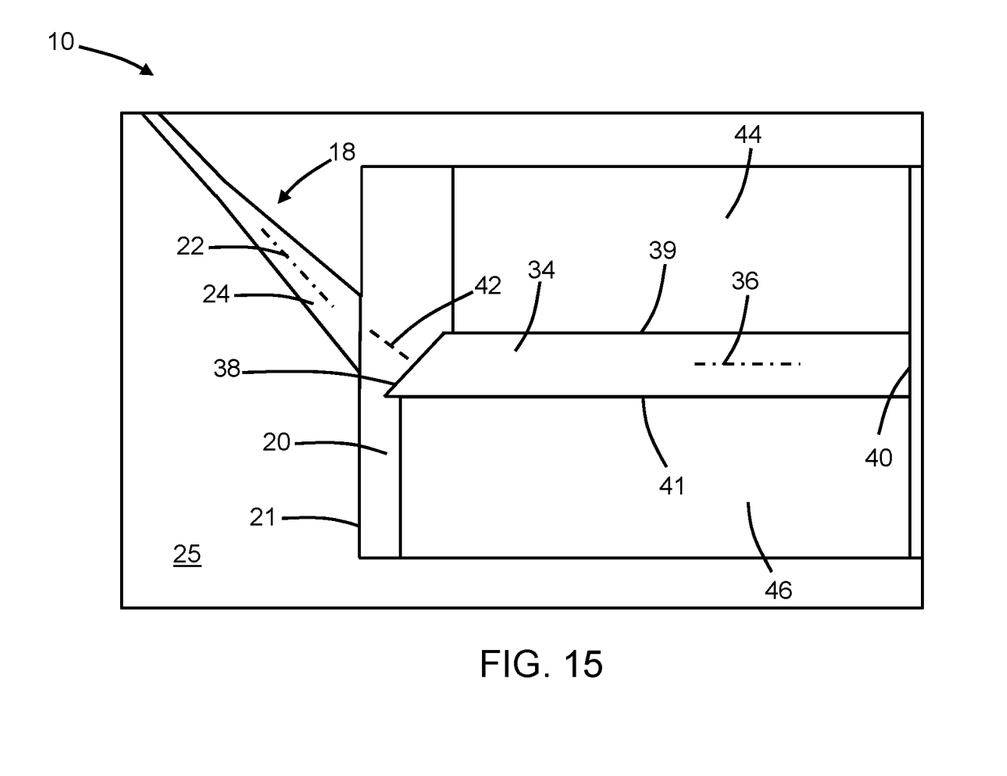

With reference to FIG. 15 in which like reference numerals refer to like features in FIG. 14 and in accordance with alternative embodiments, the end surface 38 of the light-absorbing layer 34 may be modified to be inclined or slanted. In particular, the surface normal 42 of the end surface 38 is inclined or slanted relative to the longitudinal axis 36.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. The chip may be integrated with other chips, discrete circuit elements, and/or other signal processing devices as part of either an intermediate product or an end product. The end product can be any product that includes integrated circuit chips, such as computer products having a central processor or smartphones.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising: a pad having a top surface, a side surface, and a trench with a concave sidewall adjacent to the side surface; a first waveguide core including a first taper that is directly connected to the side surface of the pad adjacent to the concave sidewall of the trench and a first longitudinal axis extending along a greatest dimension of the first waveguide core, the first taper having a width that increases with decreasing distance from the side surface; and a light-absorbing layer positioned in the trench of the pad, the light-absorbing layer including a second longitudinal axis extending along a greatest dimension of the light-absorbing layer and a first end surface intersected by the second longitudinal axis, the first end surface of the light-absorbing layer is concave, and the first end surface of the light-absorbing layer positioned adjacent to the first taper of the first waveguide core, wherein the pad and the first waveguide core comprise single-crystal silicon, the trench is surrounded by the single-crystal silicon of the pad, and the first longitudinal axis of the first waveguide core is angled relative to the second longitudinal axis of the light-absorbing layer.

2. The structure of claim 1 wherein the light-absorbing layer includes a second end surface that is spaced along the second longitudinal axis from the first end surface, and the second end surface is slanted relative to the second longitudinal axis.

3. The structure of claim 1 wherein the light-absorbing layer includes a second end surface that is spaced along the second longitudinal axis from the first end surface, and further comprising:
a second waveguide core adjoined to the pad, the second waveguide core including a second taper connected to the pad adjacent to the second end surface of the light-absorbing layer.

4. The structure of claim 3 wherein the first end surface and the second end surface of the light-absorbing layer are slanted relative to the second longitudinal axis.

5. The structure of claim 1 wherein the light-absorbing layer includes a second end surface spaced along the second longitudinal axis from the first end surface.

6. The structure of claim 1 wherein the pad includes a first doped region and a second doped region having an opposite conductivity type from the first doped region, the light-absorbing layer is laterally positioned between the first doped region and the second doped region, the light-absorbing layer includes a second end surface spaced along the second longitudinal axis from the first end surface, and the first doped region is fully positioned in the pad between the first end surface and the second end surface of the light-absorbing layer.

7. The structure of claim 1 further comprising:
a handle substrate comprising single-crystal silicon; and
a dielectric layer comprising silicon dioxide,
wherein the pad and the first waveguide core are separated from the handle substrate by the dielectric layer.

8. A structure comprising: a pad having a top surface, a side surface, and a trench with a concave sidewall adjacent to the side surface; a first waveguide core including a first taper that is directly connected to the side surface of the pad adjacent to the concave sidewall of the trench and a first longitudinal axis extending along a greatest dimension of the first waveguide core, and the first taper having a width that increases with decreasing distance from the side surface; and a light-absorbing layer positioned in the trench of the pad, the light-absorbing layer including a second longitudinal axis extending along a greatest dimension of the light-absorbing layer and a first end surface intersected by the second longitudinal axis, the first end surface of the light-absorbing layer is concave, and the first end surface positioned adjacent to the first waveguide core, wherein the pad and the first waveguide core comprise single-crystal silicon, the trench is surrounded by the single-crystal silicon of the pad, and the first end surface includes a surface normal that is slanted relative to the second longitudinal axis of the light-absorbing layer.

9. The structure of claim 8 wherein the light-absorbing layer includes a second end surface spaced along the second longitudinal axis from the first end surface, and the second end surface of the light-absorbing layer is slanted relative to the second longitudinal axis.

10. The structure of claim 9 further comprising:
a second waveguide core adjoined to the pad, the second waveguide core including a second taper connected to the pad adjacent to the second end surface of the light-absorbing layer.

11. The structure of claim 9 wherein the first end surface and the second end surface of the light-absorbing layer have a concave curvature.

12. The structure of claim 8 wherein the first end surface of the light-absorbing layer has a concave curvature.

13. The structure of claim 8 wherein the light-absorbing layer includes a second end surface spaced along the second longitudinal axis from the first end surface.

14. The structure of claim 8 wherein the pad includes a first doped region and a second doped region having an opposite conductivity type from the first doped region, and the light-absorbing layer is laterally positioned between the first doped region and the second doped region, the light-absorbing layer includes a second end surface spaced along the second longitudinal axis from the first end surface, and the first doped region is fully positioned in the pad between the first end surface and the second end surface of the light-absorbing layer.

15. The structure of claim 8 further comprising:
a handle substrate comprising single-crystal silicon; and
a dielectric layer comprising silicon dioxide, wherein the pad and the first waveguide core are separated from the handle substrate by the dielectric layer.

16. A method comprising:
forming a pad having a top surface, a side surface, and a trench with a concave sidewall adjacent to the side surface;
forming a waveguide core including a taper that is directly connected to the side surface of the pad adjacent to the concave sidewall of the trench and a first longitudinal axis extending along a greatest dimension of the waveguide core, wherein the taper has a width that increases with decreasing distance from the side surface; and
forming a light-absorbing layer positioned in the trench of the pad, wherein the light-absorbing layer includes a second longitudinal axis extending along a greatest dimension of the light-absorbing layer and an end surface intersected by the second longitudinal axis, the end surface of the light-absorbing layer is positioned adjacent to the taper of the waveguide core, the pad and the waveguide core comprise single-crystal silicon, the trench is surrounded by the single-crystal silicon of the pad, the end surface of the light-absorbing layer is concave, and the first longitudinal axis of the waveguide core is angled relative to the second longitudinal axis of the light-absorbing layer and/or the end surface includes a surface normal that is slanted relative to the second longitudinal axis of the light-absorbing layer.

17. The method of claim 16 wherein the first longitudinal axis is inclined relative to the second longitudinal axis.

18. The method of claim 16 wherein the surface normal of the end surface is slanted relative to the second longitudinal axis.

19. The method of claim 16 wherein the first longitudinal axis is inclined relative to the second longitudinal axis, and the surface normal of the end surface is slanted relative to the second longitudinal axis.

20. The method of claim 16 further comprising:
forming a first doped region in the pad; and
forming a second doped region in the pad, wherein the second doped region has an opposite conductivity type from the first doped region, and the light-absorbing layer is laterally positioned between the first doped region and the second doped region.

* * * * *